United States Patent [19]

Zeamer

[11] Patent Number: 4,613,816
[45] Date of Patent: Sep. 23, 1986

[54] CRYOGENIC MAGNETIC PROBE HAVING NEW SUBSTRATE

[75] Inventor: Geoffrey H. Zeamer, Dedham, Mass.

[73] Assignee: Geo-Sensors Corporation, Medway, Mass.

[21] Appl. No.: 596,436

[22] Filed: Apr. 3, 1984

[51] Int. Cl.[4] .................. G01R 33/035; G01R 33/022; G01R 33/24

[52] U.S. Cl. .................... 324/248; 324/247; 324/260; 324/301; 33/367; 336/208

[58] Field of Search .............. 324/244, 247, 248, 256, 324/260-262, 330, 331, 346, 301, 303, 319; 336/199, 200, 205, 208; 33/367

[56] References Cited

U.S. PATENT DOCUMENTS

| 3,435,337 | 3/1969 | Inouye et al. | 324/248 |
|---|---|---|---|
| 3,470,461 | 9/1969 | Morse | 324/248 |
| 4,253,079 | 2/1981 | Brosch | 336/84 C |
| 4,494,100 | 1/1985 | Stengel et al. | 336/200 |

OTHER PUBLICATIONS

Wynn et al, "Advanced Superconducting Gradiometers/Magnetometer Arrays . . . ", IEEE Trans. on Magnetics, vol. Mag-11, No. 2, Mar. 1975, pp. 701–707.

Zimmerman et al, "Ultrasensitive Superconducting Magnetic Gradiometer", NBS Report, Mar. 31, 1972, pp. 31–36.

Barbanera et al, "A Gradiometer for the Study . . . ", The Institute of Physics, Apr. 1978, pp. 297–298.

Postnikov et al, "An Apparatus for Measuring the Process . . . ", Cryogenics, vol. 19, No. 2, Feb. 1979, pp. 116–118.

Ishizuka et al, "A SQUID Magnetometer for Simultaneous Measurements . . . ", Jap. Jorunal of Applied. Phys., vol. 19, No. 4, Apr. 1980, pp. 639–646.

Pelizzone et al, "A SQUID Susceptometer . . . ", Appl. Physic., vol. 24, No. 4, Apr. 1981, pp. 375–379.

Primary Examiner—Gerard R. Strecker
Assistant Examiner—Warren S. Edmonds
Attorney, Agent, or Firm—Cesari and McKenna

[57] ABSTRACT

A magnetic probe for detecting the location of a magnetic anomaly. The probe includes an outer dewar jacket that defines a chamber maintained at cryogenic temperatures by a helium reservoir. Mounted on the reservoir in the chamber is a substrate which supports a plurality of pairs of gradiometer coils and a magnetometer. A plurality of SQUIDs detect the magnetic fields sensed by the magnetometer and the pairs of gradiometer coils to determine the magnetic field intensities, directions and gradients from which can be determined location, speed and direction of the anomaly. A valving network connecting the reservoir to a vent allows the probe to be operated in any orientation around its horizontal axis.

16 Claims, 8 Drawing Figures

CRYOGENIC MAGNETIC PROBE HAVING NEW SUBSTRATE

BACKGROUND OF THE INVENTION

1. Field of the Invention

The invention relates generally to the field of magnetic probes, and more specifically to magnetic probes which operate at cryogenic temperatures. Such magnetic probes are often useful in providing information as to the range, direction and velocity of magnetic anomalies. Information produced by such probes may be useful in, for example, surveying or mapping features such as mountains on land and under the sea, in oil and mineral exploration, in detecting the range, bearing and speed of moving vehicles, and in non-invasive medical diagnostic procedures such as computer-assisted tomography.

2. Description of the Prior Art

Magnetic analysis can find great utility in surveying or mapping of natural features on the land and seabed, as it can provide a substantial amount of information about the location, size and configuration of such significant cartographical features as mountains, which typically have substantial amounts of magnetic material. Similarly, magnetic analysis can provide information about subsurface rock formations which is useful in oil and mineral exploration. Such analysis can also provide information about the location and direction of movement of vehicles made of a magnetic or conductive material, which may be useful in situations in which RADAR or SONAR may not be desirable or practical. In addition, magnetic analysis can be useful in medical diagnostic applications as a replacement for, or supplement to, the use of X-rays in computer-assisted tomography.

While magnetic probes have been used in the past, they have generally been unable to provide all of the information which can be obtained from detection and analysis of magnetic fields. For example, prior magnetic probes have only been able to provide information about the general intensity of a magnetic anomaly, but they have been unable to provide other information. All of this information is useful and can be obtained from an analysis of magnetic fields.

SUMMARY OF THE INVENTION

The invention provides a new and improved magnetic probe which can provide information as to the range and direction, with respect to the probe, of a magnetic anomaly, such as an object of magnetic material, as well as its bearing and speed, also with respect to the probe. The probe operates at cryogenic temperatures and includes a dewar which houses a magnetic sensing assembly. A helium reservoir inside the dewar and in thermal contact with the magnetic sensing assembly receives liquid helium to maintain the interior of the dewar and, in particular, the magnetic sensing assembly at cryogenic temperatures. The magnetic sensing assembly includes a plurality of fingers attached to the helium reservoir which supports a substrate. The substrate, which is cooled by the helium in the reservoir, supports a three-axis magnetometer, which is used in providing information as to magnetic fields along three orthogonal axes, and a five-axis gradiometer comprising a plurality of wire coils which provides information as to gradients along the various axes of the magnetic field components along the axes. A plurality of conventional SQUIDs (superconducting quantum interference devices) are mounted on the reservoir. Each SQUID is electrically connected to a coil of the magnetometer or to a pair of the gradiometer coils. The SQUIDs measure the magnetic gradients as sensed by the respective pairs of gradiometer coils, as well as the values of the components of the magnetic field along the various axes as detected by the magnetometer.

From this information, which is iteratively taken at successive times as the probe is drawn across the area being studied, the presence, location and size of magnetic anomalies can be detected, as well as the distance, heading and speed if the anomaly is moving.

In another aspect, a new venting system is provided to allow gaseous helium to be vented from the helium reservoir while retaining the liquid helium, even if the probe, and more specifically the helium reservoir, is in any angular position with respect to its horizontal axis. The venting system includes a plurality of connections which communicate with the interior of the helium reservoir, the connections being disposed symmetrically and equi-angularly around the horizontal axis. The connections communicate with a single vent to the exterior of the probe. Each connection includes a gravity-responsive valve which is closed when below a selected angle with respect to the vertical, and communicates with the vent through a valving arm that includes three gravity-responsive valves disposed at right angles to each other. The valving arms are also symmetrically disposed around the horizontal axis of the reservoir. When the angular position of the probe around its horizontal axis causes a connection to be above a selected elevation, the connection and all of the valves of the valving arm connecting it to the vent are open. However, in the valving arms connecting the others to the vent, the connection and/or at least one of the valves will be closed. Thus, if the helium reservoir is not filled to a point above the elevation at which the one valving arm allows communication between its connection and the vent, only the evaporated gaseous helium will be allowed to escape; the other connections and valving arms will prevent the liquid helium from escaping from the reservoir. Since the connections and valving arms are symmetrical around the reservoir's axis, the valving action is independent of the reservoir's angular position around the axis.

BRIEF DESCRIPTION OF THE DRAWINGS

This invention is pointed out with particularity in the appended claims. The above and further advantages of this invention may be better understood by referring to the following detailed description taken in conjunction with the accompanying drawings, in which:

DESCRIPTION OF THE PREFERRED EMBODIMENTS

Figure 1:
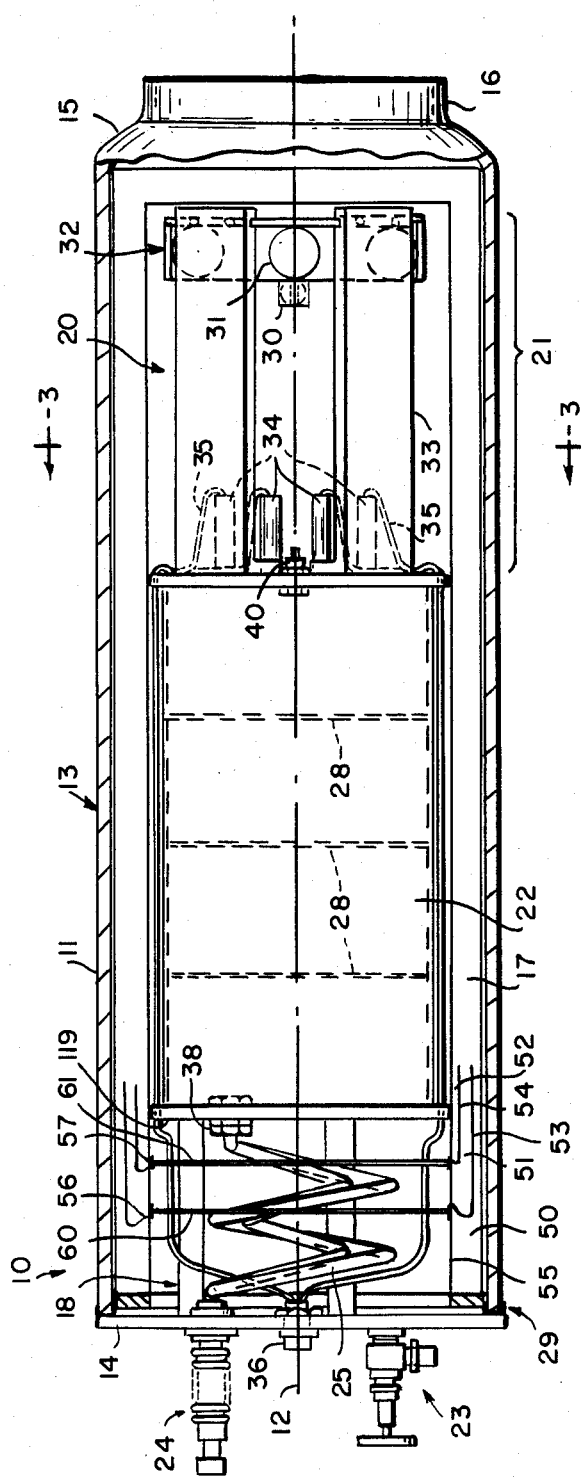
FIG. 1 is a side elevational view, in section, of a magnetic probe constructed in accordance with the invention.

FIG. 1 depicts a side elevational view of a magnetic probe 10 which is useful in providing information about the location of magnetic anomalies. The probe 10 includes an outer dewar housing 11 which has a generally elongated cylindrical configuration centered along a longitudinal axis generally indicated by reference numeral 12. The dewar 11 includes an elongated cylindrical sidewall member 13, a front end plate 14 attached to the left end as shown in FIG. 1, and a rear end cap 15. The rear end cap includes a cylindrical skirt 16 which allows the dewar to be stood on end (with axis 12 vertical) for maintenance or storage. Since the interior of probe 10 is preferably maintained at cryogenic temperatures, the dewar 11 may be constructed from, for example, well-known glass epoxy materials such as the epoxy sold under the designation G-10. Such materials have a very low co-efficient of expansion or contraction from room temperature to cryogenic temperatures, specifically to the boiling point of liquid helium, or 4.2° Kelvin.

Figure 2:
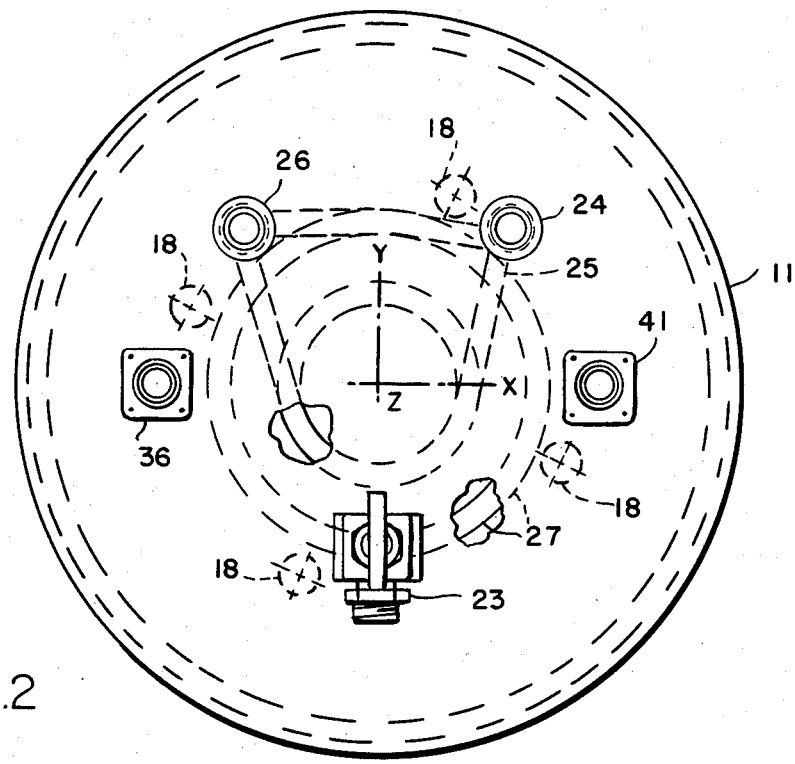
FIG. 2 is a front view of the probe, as taken from the left-hand side in FIG. 1.

Lining the interior walls of dewar 11 is insulation 17 which defines and forms an interior elongated cylindrical chamber 20. Within chamber 20 is disposed a magnetic sensing module 21 and a helium reservoir 22 which receives liquid helium and maintains the interior of the probe, and specifically the sensing module 21, at cryogenic temperatures. The helium reservoir is held in chamber 20 at a predetermined minimum distance from front plate 14 by a plurality of cylindrical spacers 18 (see also FIG. 2), which may also be formed from the aforementioned glass epoxy. The chamber 20 may be evacuated through a vacuum valve fitting 23 which is mounted on the front plate 14 (see also FIG. 2). The helium reservoir 22 is filled with helium through a fill port 24, which communicates with the interior of helium reservoir 22 through a fill tube 25. The fill port may be plugged when the reservoir has been filled with helium. In addition, a vent 26, which also communicates with the interior of the helium reservoir 22 through a vent tube 27 and vent connection 38, allows helium gas, which evaporates from the liquid helium inside of the helium reservoir, to be vented to the atmosphere. The interior of the helium reservoir is thus maintained at atmospheric pressure.

In one specific embodiment, the insulation 17 comprises three separate layers 50, 51, and 52. Each insulation layer comprises a plurality of layers of metalized plastic sheets such as Mylar. The thin layer of metalization on the plastic sheets serves to reflect incident heat and light which might serve to raise the temperature of the inside of magnetic probe 21 and specifically of the helium reservoir 22. The layers 50, 51, and 52 are separated by cylindrical shields 53 and 54 which extend the length of the probe and also around the rear (the right end, as shown in FIG. 1) thereof. An interior glass epoxy cylinder 55 defines chamber 20. The shields 53 and 54 are preferably of a heat-conducting material such as copper to allow them to maintain a uniform temperature throughout the length of the probe. The shields may be formed from a fine copper wire aligned to reduce eddy currents which may otherwise be generated in the shields as the probe is drawn through the ambient magnetic field, which can serve to induce anomalous local disturbances in the magnetic field being sensed.

The forward ends (to the left as shown in FIG. 1) of shields 53 and 54 connect to conductive tabs on cylinder 55 generally indicated at 56 and 57 respectively. Each tab is in thermal contact with a forward insulating plate 60 and 61. The plates 60 and 61 also serve to maintain the forward end of the chamber 20 in the probe 10 at about the same temperature as the respective shield. Specifically, shield 54 and plate 61 have a substantially uniform temperature, by reason of their being in thermal contact with each other. Similarly, the shield 53 and plate 60 jointly maintain a substantially uniform temperature. It should be noted that the temperature maintained by shield 54 and plate 61 will be generally lower than the temperature maintained by shield 53 and plate 60, since shield 54 and plate 61 are situated interiorly of shield 53 and plate 60, and thus are closer to the helium reservoir. The spaces between the helium reservoir 22 and the front end plate are also preferably filled with layers of metalized mylar sheet insulation (not shown).

In one embodiment, the plates 60 and 61 are preferably formed from a rigid plastic sheet material, such as may be used in printed circuit boards. The plates have a layer of copper on each side thereof, which has been etched away to form a wedge pattern on each side. Wires which extend between the magnetic sensing module 21 and terminals on the end plate 14 may be individually coupled through the plates and in thermal contact with individual copper wedges to assist in cooling the wires. Since the copper wedges are electrically isolated from each other by the plastic sheet material, the wires attached to the separate wedges are electrically insulated from each other by the plastic sheet material which carries them.

Furthermore, in one specific embodiment the plates 60 and 61 are also in thermal contact with both inlet tube 25 and outlet tube 27. The cool helium gas which vents from helium reservoir 22 through vent tube 27 serves to further assist in cooling the plates 60 and 61. Similarly, the helium input to helium reservoir 22 through fill tube 25 is cooled by the plates 60 and 61 before it enters the helium reservoir thus reducing the thermal influx into chamber 20.

The interior of helium reservoir 22 may include a plurality of perforated bulkheads 28 which serve to reduce splashing and movement of the liquid helium within the reservoir while the probe is in use. Any movement of the helium liquid in the reservoir can serve to raise the internal temperature in the reservoir and can also cause magnetic changes and physical vibrations in probe 10 which can adversely effect the information obtained therefrom.

As has been mentioned, chamber 20 is evacuated to enable the helium reservoir to maintain the magnetic sensing module at cryogenic temperatures. To reduce strains at the rear of probe 10 due to the differential in pressures inside and outside the probe, the end cap 15 is preferably curved, and may define a section of a sphere. The front end plate 14 may be secured to the forward edge of cylindrical member 13; however, in one specific embodiment the forward edge is covered by a gasket 29, and the end plate is held sealed to the gasket by the air pressure differential between the outside of the probe and the evacuated interior chamber 20. Thus, if helium reservoir 20 were to rupture and the pressure of the helium gas were to build up, the end plate 14 would become dislodged from its sealing relationship with gasket 29, thereby allowing the excess helium gas to escape. Such an arrangement prevents explosive pressures from building up inside the probe.

As has been mentioned, the interior glass wall 55 defines a generally cylindrical chamber with an opening normally closed off by removable end plate 14. As can be seen from FIG. 1, in one embodiment the helium reservoir 22 is also cylindrical and the sensing module 21, while not cylindrical, can be moved along axis 12 within the chamber defined by wall 55. It will be appreciated that the reservoir 22 and module 12, which are both affixed to front end plate 14, as well as plates 60 and 61 and the insulation therebetween, can be easily removed from the chamber 20 by bringing the interior of the probe to atmospheric pressures and withdrawing plate 14. The layers forming insulation 17 will be retained in the dewar 11 by glass wall 55. This specific configuration of the probe simplifies the repair and maintenance of the probe and sensing module.

The magnetic sensing module 21 of probe 10 (FIG. 1) includes a three-axis magnetometer 30 and a plurality of wire coils, generally indicated by reference numeral 31, all of which are supported by a substrate 32. The substrate, which is formed of a ceramic glass, is supported in the rear of chamber 20 by a plurality of fingers 33. The substrate 32, and the coils 31 and magnetometer 30 supported thereby, are in thermal contact with, and cooled by fine copper litzwire (not shown), which, in turn is in thermal contact with the liquid helium in helium reservoir 22 through a coupling 40. The fitting provides a thermal anchor for the litzwire both internal and external to the reservoir. Thus, the substrate, coils, and magnetometer are all maintained at cryogenic temperatures by the liquid helium in helium reservoir 22.

Magnetic sensing module 21 also includes a plurality of SQUIDs generally indicated by reference numeral 34 which are mounted on and in direct thermal contact with the rear of helium reservoir 22. The SQUIDs are thus also cooled by the liquid helium in the reservoir. They may also be surrounded by litzwire anchored to fitting 40 to provide additional cooling if desired. The SQUIDs are electrically connected to the gradiometer coils 31 and magnetometer coils 30 on substrate 32 by means of wires affixed to the fingers 33. The wires connecting the SQUIDs and coils, as well as the coils themselves are preferably of a material, such as niobium, which is superconducting at the cryogenic temperature maintained by the helium in helium reservoir 22. The wires and coils are preferably superconducting to permit them to carry, by induction, signals representative of steady or slowly varying magnetic flux to the inputs of the SQUIDs; non-superconducting wires and coils will typically not exhibit such inductive transfer of steady fields. The outputs of the SQUIDs 34 are connected through wires 35 to an electrical connector 36 (see also FIG. 2) on front plate 14 of the probe 10.

In addition, a temperature sensor such as a conventional diode-resistor pair (not shown) may be mounted in the chamber 20 to measure the temperature of the helium reservoir and/or the magnetic sensor. Wires (also not shown) connect the temperature sensor to a connector 41 on the front plate 14 of probe 10.

Figure 3:
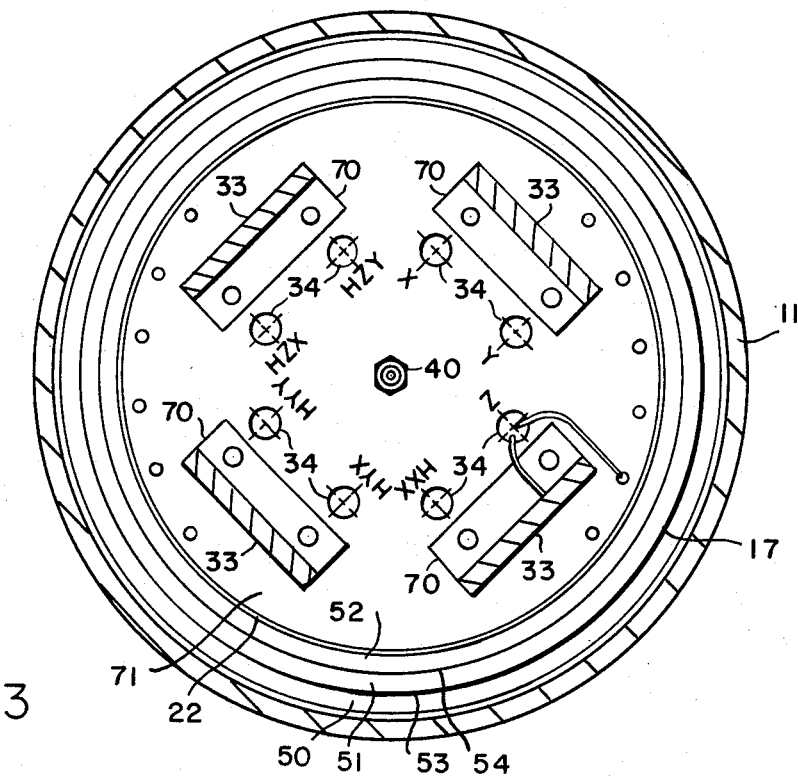
FIG. 3 is a sectional view of the probe taken along line 3—3 in FIG. 1.

FIG. 3, which depicts a sectional view of probe 10 along the lines 3—3 in FIG. 1, illustrates the positioning of SQUIDs 34, fingers 33, and coupling 40 on the rear bulkhead 71 of helium reservoir 22. As shown in FIG. 3, each finger 33 includes a lower flange 70 which is attached to the rear bulkhead 71 of helium reservoir 22. The four fingers are symmetrically disposed around rear bulkhead 71. Eight SQUIDs are symmetrically mounted on bulkhead 71 interiorally of the fingers 33.

Figure 4A:
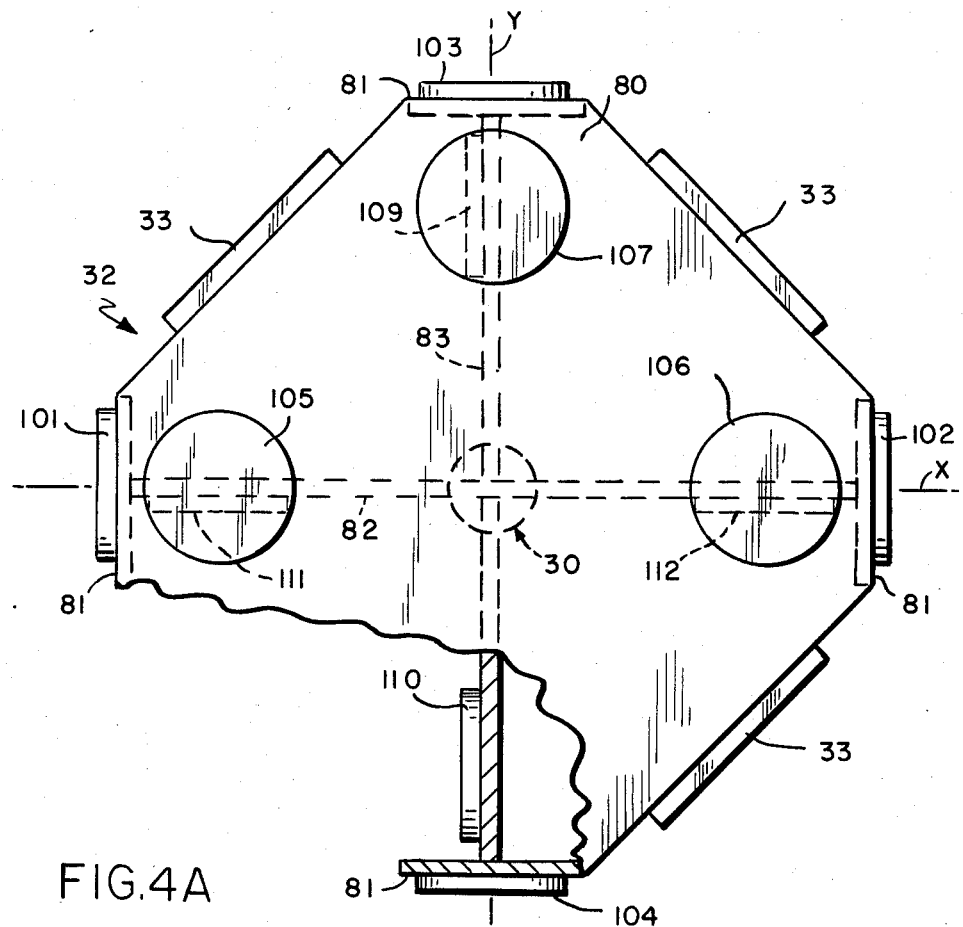
FIGS. 4A and 4B are top and side views, respectively, of a substrate used in the probe depicted in FIG. 1, and illustrating the disposition of the coils and magnetometer supported by the substrate.
Figure 4B:
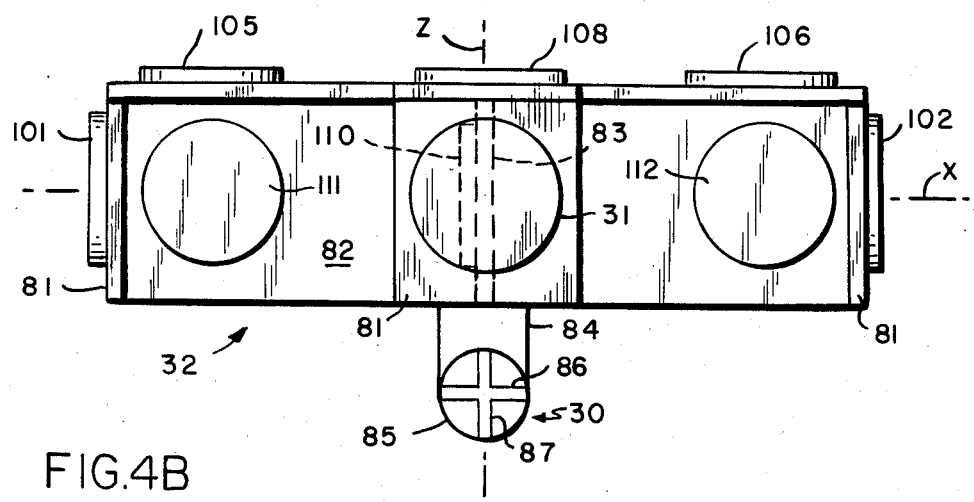

As has been mentioned, the fingers 33 support the substrate 32, which is illustrated in detail in FIGS. 4A and 4B. With reference to those figures, substrate 32 includes an octagonal top member 80 with four skirt members 81 depending from four opposing edges thereof. The four opposing edges without skirt members 81 attach to the finger members 33. Underneath top member 80 are two cross members 82 and 83 whose ends generally bisect skirt members 81; the cross members generally define X and Y axes. With reference to FIG. 4B, a Z axis is defined perpendicularly to the top member 80 at the intersection of the cross members 82 and 83. The Z axis corresponds to the probe's horizontal axis 12 (FIG. 1).

Depending from the intersection of the cross members 82 and 83 is a support 84 for the three-axis magnetometer 30. The magnetometer includes three intersecting circular coils indicated by reference numerals 85, 86 and 87, each of which relates to a magnetic field component in directions parallel to the Y, Z, and X axes, respectively. That is, the coil 85, which lies in the X-Z plane, senses the magnetic field which is parallel to the Y axis. Similarly, coil 86, which lies in a plane parallel to the X-Y plane, senses the magnetic field in the Z direction. Finally, coil 87, which lies in the Y-Z plane, senses the magnetic field in the X direction.

Substrate 32 also supports the wire gradiometer coils which generally identified by the reference numeral 31 (FIG. 1) and which are specifically identified in FIGS. 4A and 4B as coils 101 through 112. The four skirts 81 each support a coil 101 through 104, four coils 105 thorugh 109 are mounted on top member 80 with one coil being situated adjacent to each edge having a skirt member 81, and coils 109 through 112 are situated on the cross members 82 and 83 also adjacent to the skirt members.

The coils 85, 86 and 87 forming magnetometer 30, provide information as to the level of magnetic field components along the three axes. The coils 101 through 112, opposing pairwise, provide information as to the gradients, in the X, Y and Z directions, of the magnetic field components along the three axes. Thus, the pair of coils 101 and 102 provides information as to the gradient along the X axis of the component of the magnetic field in the X direction. Similarly, the coils 103 and 104 provide information as to the gradient along the Y axis of the component of the magnetic field in the Y direction. The pair of coils 105 and 106 provides information as to the gradient along the X axis of the Z component of the magnetic field. The pair of coils 107 and 108 provides information as to the gradient along the Y axis of the magnetic field component in the Z direction. Similarly, the pair of coils 109 and 110 provides information as to the gradient along the Y axis of the magnetic field in the X direction, and the pair of coils 111 and 112 provides information as to the gradient along the X direction of the magnetic field in the Y direction. It should be noted that the gradients in the X, Y and Z directions of the component of the magnetic field in the Z direction are not explicitly provided. However, that information can be obtained from an analysis of the information provided by the gradiometer coils of the other gradients, if it is needed.

With reference again to FIG. 3, three of SQUIDs 34, specifically those labelled X, Y, and Z, sense the levels of the magnetic field components in each of the X, Y, and Z axes as detected by the coils 85 through 87 forming magnetometer 30. The SQUID labelled "X" in FIG. 3 is electrically connected to the coil 87 to provide information as to the component of the magnetic field the X axis direction. Similarly, the SQUID 34 labelled "Y" is electrically connected to coil 85 to provide information as to the magnetic field component in the Y direction, and the SQUID labelled "Z" is electrically connected to the coil 86 to provide information as to the component of the magnetic field in the Z direction.

The remaining SQUIDs are connected to opposing pairs of coils on substrate 32 to provide information on the respective gradients of the magnetic field components in the respective directions. Specifically, the SQUID labelled "HXX" is connected to coils 101 and 102 to provide information as to the gradient along the X axis of the magnetic field component in the X direction. Similarly, the SQUID labelled "HYX" is connected to the coils 111 and 112 to provide information as to the gradient along the X axis of the magnetic field component in the Y direction. The SQUID labelled "HYY" is connected to the coils 103 and 104 to provide information as to the gradient along the Y axis of the magnetic field component in the Y direction. Similarly, the SQUID labelled "HZX" is connected to the pair of coils 111 and 112 to provide information as to the gradient along the X axis of the component of the magnetic field in the Z direction. Finally, the SQUID 34 labelled "HZY" is electrically connected to the coils 107 and 108 to provide information as to the gradient along the Y axis of the component of the magnetic field in the Z direction. It should be noted that none of SQUIDs 34 are electrically connected to the coils 109 and 110 in this specific embodiment. Those coils would provide information of the gradient along the Y axis of the magnetic field in the X direction, that is, "HXY". This information can be determined from the gradients provided by the existing connections between the coils on the remaining forms and the SQUIDs. However, the coils on forms 109 and 110 are provided as spares and can be connected to a SQUID if necessary.

In operation, each of the coils 85 through 87 forming magnetometer 30, and the respective pairs of coils 101 through 112 mounted on substrate 32, are connected to respective ones of SQUIDs 34. Currents are induced in the coils by the movement of the probe through the ambient magnetic field of the area being surveyed, which reflects the effects on the earth's magnetic field of magnetic anomalies which may be present. As the probe 10 is drawn across the area being studied, the ambient magnetic field in the area being studied causes the induced currents to change in proportion to the effects of the magnetic anomalies present. These induced currents are sensed by the respective SQUIDs to provide information as to the magnetic anomaly. This information, taken at successive known locations as the probe is drawn over the area being studied, in turn provides information as to the specific location of magnetic anomalies throughout the area being studied, as well as the range, bearing and speed if the anomaly is moving.

As has been mentioned, the magnetic probe 10 (FIG. 1) can be used to survey land or a seabed if mounted in a suitable housing (not shown) and towed by, for example, an airplane or a sea vessel. When the probe 10 is so used, it should be noted that the probe may be disposed in any angular orientation around its horizontal axis 12. It can be seen by inspection of FIG. 1 that, depending on the position of the vent connection 38 on helium reservoir 22 and the level of liquid helium in the helium reservoir, the liquid helium may flow out the vent tube. This may be most likely to occur if, for example, vent connection 38 is below the horizontal axis 12, which may occur while the probe 10 is being towed, as the angular orientation of the probe around the axis cannot be totally controlled while it is being towed. It will be appreciated that the size of the spiral of vent tube 27 can reduce the problem, but it will not totally eliminate it.

Figure 5A:
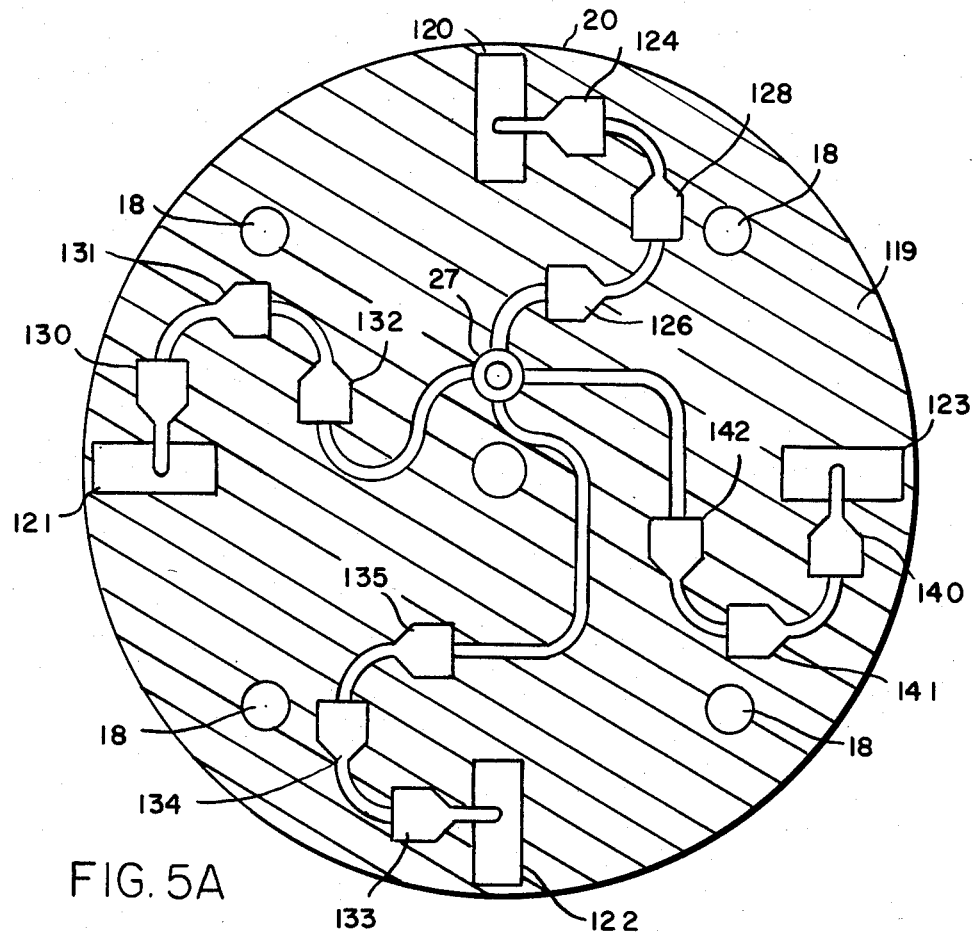
FIG. 5A depicts a schematic plan view of a valving network that may be used in the probe depicted in FIG. 1.

Accordingly, a valving network, depicted in plan view in FIG. 5A, may be added to probe 10, and specifically between vent tube 27 and helium reservoir 22, to permit gaseous helium to vent from the interior of the reservoir and prevent liquid helium from flowing therefrom when the probe is in any angular orientation around the horizontal axis. With reference to FIG. 5A, the valving network includes four vent connections 120, 121, 122, and 123 which are situated near the outer edge of the front bulkhead 119 of helium reservoir 22 and are in communication with the interior of the helium reservoir. Each of connections 120 through 123 are, in turn, in communication with the vent tube 27 (FIGS. 1 and 2) through a valve arm, which includes three valves connected at right angles to each other. Specifically, the vent connection 120 is connected through a valve arm comprising valves 124, 125, and 126. Similarly, vent connection 121 is connected to vent tube 27 through a valve arm comprising valves 130, 131, and 132, vent connection 122 is in communication with vent tube 27 through a valve arm comprising valves 133, 134, and 135, and vent connection 123 is in communication with vent tube 27 through a valve arm comprising valves 140, 141, and 142.

Figure 5B:
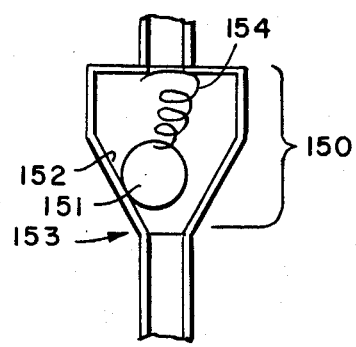
FIG. 5B depicts a cross-sectional view of a valve useful in the valving network of FIG. 5A.

With reference to FIG. 5B, each of the valves 124 through 126, 130 through 135, and 140 through 142 is comprised of a funnel shaped member 150, a ball 151 of sufficient diameter to close off the small end 153 of the funnel shaped member and a spring member 154 which biases the ball toward the small end. The funnel shaped member includes an inclined surface 152 which directs the ball to small end 153 when the angle of the valve is above a selected angle with respect to the horizontal, and specifically when the angle of the inclined surface is above the horizontal. The ball is biased to roll down the inclined surface 152 to seal off the small end 153 and prevent communication therethrough when the inclined surface 152 is in the correct orientation therefor. However, when the portion of the inclined surface supporting the ball tips beyond a certain point, the ball rolls away from the small end to open the valve and allow fluid flow therethrough.

Figure 5C:
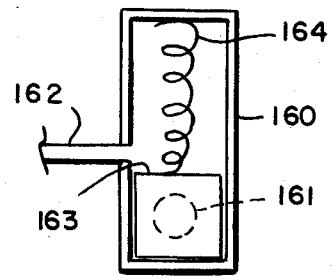
FIG. 5C depicts a cross-sectional view of a vent connection useful in the valving network of FIG. 5A.

With reference to FIG. 5C, each of the vent connections comprises a housing 160 having an aperture 161 towards one end of the connection housing which is in communication with the interior of the helium reservoir and a tube 162 which connects to the nearest valve in the respective valve arm. A slidable block 163 is biased by a spring 164 to close off the aperture 161, as shown in the FIG. 5C. However, if the housing 161 is rotated, by the rotation of the helium reservoir, so that the aperture 161 is toward the upper end of the housing, the block 163 will compress spring 164, allowing fluid communication between aperture 161 and tube 162.

Thus, with reference again to FIG. 5A, the vent connections 120 through 123 are disposed so that the respective apertures are towards the periphery of the bulkhead. Thus, it will be appreciated that vent connection 120 will be open, and vent connections 121 through 123 will be closed.

With continued reference to FIG. 5A, if the probe 10 has the orientation depicted in FIG. 5A, that is, with vent connection 120 on the upper vertical and vent connection 122 on the lower vertical, it can be seen that the inclined surfaces 152 of all of valves 124 through 126 will be so disposed that all of the valves will be open. Thus, the vent connection 120 will be in open communication with vent tube 27, which allows gaseous helium, which would be present at that elevation in the reservoir, to escape from the interior of helium reservoir 22. With respect to the remaining vent connections 121, 122, and 123, it will be apparent from observation that at least one of the valves in the other three valve arms, which connect vent connections 121 through 123 with vent tube 27, will be closed. Specifically, as a result of the orientations of the inclined surfaces 152 of valves 130, 134 and 142, all of those valves will be closed. The closed valves inhibit the communication between the three vent connections 121 through 123 with vent tube 27. Thus, liquid helium may be above the level of vent connections 121 and 123 in the reservoir and be retained in the reservoir by the closed valves.

It can be further seen, by observation of FIG. 5A, that, if probe 10 is rotated so that vent connection 121 is directly up, the vent connection as well as the valves 130 through 132 in the valve arm connecting that vent connection to vent tube 27 will be open, whereas vent connections 120, 122 and 123 and valves 133, 141, and 126 in the valve arms connecting those vent connections to vent tube 27 will be closed. It is thus apparent that, whatever the orientation of probe 10 around the horizontal axis, the vent connection and all of the valves in the valve arm connecting the uppermost vent connection will be open, thereby allowing direct communication between that vent connection and vent tube 27 to permit gaseous helium to escape from the helium reservoir. However, in the arms connecting to the remaining vent connections to vent tube 27, the vent connection and at least one valve will be closed, thereby inhibiting communication therethrough from the interior of helium reservoir 22 to vent tube 27 and preventing liquid helium from escaping from the reservoir.

The foregoing description has been limited to a specific embodiment of this invention. It will be apparent, however, that the invention can be practiced in diverse basic constructions than is disclosed in this specification with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A magnetic probe for detecting the range and direction of magnetic anomalies comprising:
   (a) a housing defining a chamber;
   (b) cryogenic means mounted inside said chamber for maintaining the interior of said chamber at cryogenic temperatures;
   (c) magnetic sensing means including:
      (i) substrate means situated in said chamber for supporting magnetometer means and a plurality of gradiometer coil means for sensing magnetic field components along selected axes, said substrate means comprising plate means having depending from opposing edges thereof pairs of skirt means, said plate means further supporting a magnetometer support means, each of said pairs of skirt means including means for supporting said gradiometer coil means and said plate means including means adjacent each said skirt means for supporting a said gradiometer coil means, said substrate means being thermally connected to said cryogenic means to maintain said substrate, said magnetometer means and said gradiometer coil means at cryogenic temperatures; and
      (ii) detection means situated in said chamber and in thermal contact with said cryogenic means to maintain said detection means at cryogenic temperatures, said detection means being electrically connected to said magnetomer means and to said gradiometer coil means for detecting the direction, strength and gradient of the ambient magnetic field, thereby to provide information as to the direction and range of the magnetic anomalies with respect to the probe.

2. A magnetic probe as defined in claim 1 wherein said substrate means further comprises orthogonal support member means depending from said plate means adjacent to each said skirt means and transverse thereto, each said orthogonal support member means supporting a said gradiometer coil means.

3. A magnetic probe as defined in claim 2 wherein said magnetometer means includes a plurality of magnetometer coil means each lying a plane, with the planes transverse with respect to each other.

4. A magnetic probe as defined in claim 3 wherein said detection means comprises a plurality of detection members, selected ones of which being connected to a magnetometer coil means and others being connected to pairs of gradiometer coil means, said detection means connected to said magnetometer coil means detecting the magnitude of the interference of the magnetic fields generated thereby and said detection means connected to said pairs of gradiometer coil means detecting the gradient of the interference of the magnetic field components along the respective directions.

5. A magnetic probe as defined in claim 1 wherein said housing comprises a dewar means having an interior surface being covered with insulation means, the interior of said insulation means defining said chamber.

6. A magnetic probe as defined in claim 5 wherein said insulation means comprises a selected number of shield means concentric with the interior surface of said dewar means, the spaces defined by said dewar means and said shield means being filled with layers of sheets of a plastic sheeting material having a light-reflective surface.

7. A magnetic probe as defined in claim 6 wherein said dewar means includes means defining an opening for receiving a dewar cap means, each said shield means being concentric with said dewar means and having a tab means in thermal contact with plate means interiorly of said dewar cap means, said respective shield means and plate means being of a thermally conductive material to maintain them at respective uniform temperatures.

8. A magnetic probe as defined in claim 7 further comprising interior housing means disposed interiorly of said sheeting material to retain said sheeting material against the interior wall of said dewar means, said opening being dimensioned to enable the cryogenic means and said magnetic sensing means to be inserted or withdrawn therethrough.

9. A magnetic probe as defined in claim 1 wherein said cryogenic means comprises reservoir means disposed in said chamber for receiving fluid at cryogenic temperatures and thereby maintain said chamber at cryogenic temperatures.

10. A magnetic probe as defined in claim 9 wherein said housing further comprises fill means and vent means in communication with the interior of said reservoir means through fill tube means and vent tube means, respectively.

11. A magnetic probe as defined in claim 10 wherein said vent tube means communicates with the interior of said reservoir means through a valving network comprising:
   a. a plurality of vent connection means disposed equi-angularly around said reservoir means; and
   b. a like plurality of valving arm means each comprising a plurality of valve means connecting a respective vent connection means to said vent tube means, each said valve means being responsive to the orientation of said probe such that all of the valve means in the valving arm means connected to the vent connection means having the highest elevation are open and at least one of the valve means in the valving arm means connected to the other vent connection means are closed.

12. A magnetic probe as defined in claim 9 wherein said reservoir means includes an interior bulkhead means to inhibit excessive motion of cryogenic fluid in said reservoir means, said interior bulkhead means being perforated to permit the limited flow of cryogenic fluid therethrough.

13. A magnetic probe as defined in claim 9 wherein said cryogenic means further includes litzwire in thermal contact with said reservoir means and extending to and in thermal contact with said magnetic sensing module to enable the cryogenic means to cool said magnetic sensing module to cryogenic temperatures.

14. A substrate member for supporting a plurality of coil means and magnetometer means in a cryogenic magnetic probe, said coil means providing information as to the location of magnetic anomalies, said substrate member comprising plate means having depending from opposing edges thereof a pair of skirt means, said plate means further having depending therefrom a magnetometer support means, each of said skirt means including means for supporting a said coil means, and said plate means further including means adjacent each said skirt means for supporting a said coil means.

15. A magnetic probe as defined in claim 14 wherein said substrate means further comprises orthogonal support member means depending from said plate means adjacent to each said skirt means and transverse thereto, each said orthogonal support member means supporting a said coil means.

16. A magnetic probe as defined in claim 15 wherein said magnetometer means includes a plurality of coil means each lying a plane, with the planes transverse with respect to each other.

* * * * *